United States Patent
Tzanidis et al.

(10) Patent No.: US 9,391,370 B2
(45) Date of Patent: Jul. 12, 2016

(54) ANTENNA FEED INTEGRATED ON MULTI-LAYER PCB

(71) Applicant: Samsung Electronics Co., Ltd., Suwon-si, Gyeonggi-do (KR)

(72) Inventors: Ioannis Tzanidis, Dallas, TX (US); Robert Monroe, Melissa, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/752,531

(22) Filed: Jun. 26, 2015

(65) Prior Publication Data

US 2015/0381229 A1    Dec. 31, 2015

Related U.S. Application Data

(60) Provisional application No. 62/019,129, filed on Jun. 30, 2014.

(51) Int. Cl.
| | |
|---|---|
| *H04M 1/00* | (2006.01) |
| *H01Q 9/18* | (2006.01) |
| *H01Q 1/50* | (2006.01) |
| *H01Q 1/48* | (2006.01) |

(52) U.S. Cl.
CPC . *H01Q 9/18* (2013.01); *H01Q 1/48* (2013.01); *H01Q 1/50* (2013.01)

(58) Field of Classification Search
CPC ............. H04B 1/40; H01Q 1/50; H01Q 1/48; H01Q 9/18

USPC ........................................................ 455/575.7
See application file for complete search history.

(56) References Cited

U.S. PATENT DOCUMENTS

| | | |
|---|---|---|
| 2004/0185811 A1 | 9/2004 | Woo et al. |
| 2014/0104801 A1 | 4/2014 | Saji et al. |
| 2014/0145883 A1 | 5/2014 | Baks et al. |

FOREIGN PATENT DOCUMENTS

| | | |
|---|---|---|
| JP | 2007189152 A | 7/2007 |
| JP | 2009081423 A | 4/2009 |

OTHER PUBLICATIONS

International Search Report, dated Sep. 24, 2015, in connection with Application No. PCT/KR2015/006729, 3 pages.
Written Opinion of the International Searching Authority, dated Sep. 24, 2015, in connection with Application No. PCT/KR2015/006729, 5 pages.

*Primary Examiner* — Eugene Yun

(57) ABSTRACT

A transmitter includes apparatus for integrating the antenna feed into a multilayer PCB. The apparatus includes an antenna element disposed over the multilayer PCB having slot openings that substantially overlap and that enable an RF signal to be coupled from a printed transmission line located on one of the multilayer PCB conductive layers. The multilayer PCB board hosts at least one transceiver unit and a baseband unit such that the antenna feed, transceiver and baseband units are integrated on a single multilayer PCB board without degradation of antenna bandwidth and efficiency.

20 Claims, 12 Drawing Sheets

ANTENNA FEED INTEGRATED ON MULTI-LAYER PCB

CROSS-REFERENCE TO RELATED APPLICATION(S) AND CLAIM OF PRIORITY

The present application claims priority to U.S. Provisional Patent Application Ser. No. 62/019,129, filed Jun. 30, 2014, entitled "ANTENNA FEED INTEGRATED ON MULTI-LAYER PCB". The content of the above-identified patent document is incorporated herein by reference.

TECHNICAL FIELD

The present application relates generally to wireless communications devices and, more specifically, to an antenna feed integrated on a multi-layer printed circuitry board.

BACKGROUND

Recently, a new Multiple-Input-Multiple-Output (MIMO) system called the Full-dimensional MIMO (FD-MIMO) has shown great potential to improve the spectral efficiency of the current Long Term Evolution (LTE) networks. FD-MIMO applies a large number of active antenna elements arranged in a two-dimensional lattice at the Base-Station (BS). As such the BS array is capable of beamforming in azimuth and elevation providing sufficient degrees of freedom to support Multi-User MIMO (MU-MIMO). The operation frequency of base stations depends on spectrum availability, service provider and duplex scheme used. For example, LTE TDD bands #41 (2.496-2.69 GHz) and #42 (3.4-3.6 GHz) and FDD bands #7 (2.5-2.57 GHz UL and 2.62-2.69 GHz DL) and #22 (3.41-3.5 GHz UL and 3.51-3.6 GHz DL) provide suitable spectrum for FD-MIMO. At these frequency bands, wavelengths are in the range of 8-12 cm and therefore antenna systems are relatively bulky, considering that FD-MIMO systems could be comprised of hundreds of active antennas. As such a high degree of integration is necessary to maintain an overall small form factor, low cost, light weight, and avoid unnecessary power loss. This means that the several boards that make up the active antenna system such as the antenna board, the antenna feed board, the transceiver board, and baseband board need to be integrated in one compact unit.

Typically, integrating a transceiver and baseband boards requires multilayer PCB technology and extremely efficient system architecture. However, antenna and antenna feed board integration is not straightforward because it typically results in loss of bandwidth and efficiency.

SUMMARY

In a first embodiment, an antenna system is provided. The antenna system includes an antenna element disposed proximate to a multilayer printed circuit board (PCB) stack-up. The multilayer PCB stack-up includes N alternating conductive and dielectric layers, wherein a first conductive layer is configured to serve as an antenna ground plane layer and includes a slot opening with lateral dimensions smaller than lateral dimensions of the antenna element, a second conductive layer is configured to serve as a shielding layer, a third conductive layer is configured to serve as a system ground plane layer. The multilayer PCB stack-up also includes at least two first slot openings having lateral dimensions smaller than the lateral dimensions of the antenna element, the at least two slot openings disposed at similar lateral locations and through at least two consecutive conductive layers such that the slot openings substantially overlap with each other. The multilayer PCB stack-up also includes a transmission line printed on at least one conductive layer, the transmission line configured to carry a radio frequency (RF) signal and to couple the RF signal to the antenna element through at least one of the at least two slot openings. The multilayer PCB stack-up also includes at least one conductive layer having portions configured to carry a direct current (DC) signal. The multilayer PCB stack-up also includes at least one RF transceiver unit electrically coupled to the transmission line and at least one baseband processing unit electrically coupled to the RF transceiver unit. The multilayer PCB stack-up further includes a plurality of conductive layer-interconnecting vias configured to enable a conductive connection between the ground plane layer and portions of the antenna ground plane layer, the shielding layer and portions of the conductive layers of the multilayer PCB stack-up, the vias disposed through all conductive layers distributed across a substantial portion of the area of the multilayer PCB stack-up that does not include the slot openings.

Other technical features may be readily apparent to one skilled in the art from the following figures, descriptions, and claims. Definitions for other certain words and phrases are provided throughout this patent document. Those of ordinary skill in the art should understand that in many if not most instances, such definitions apply to prior as well as future uses of such defined words and phrases.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications device.

Figure 1:
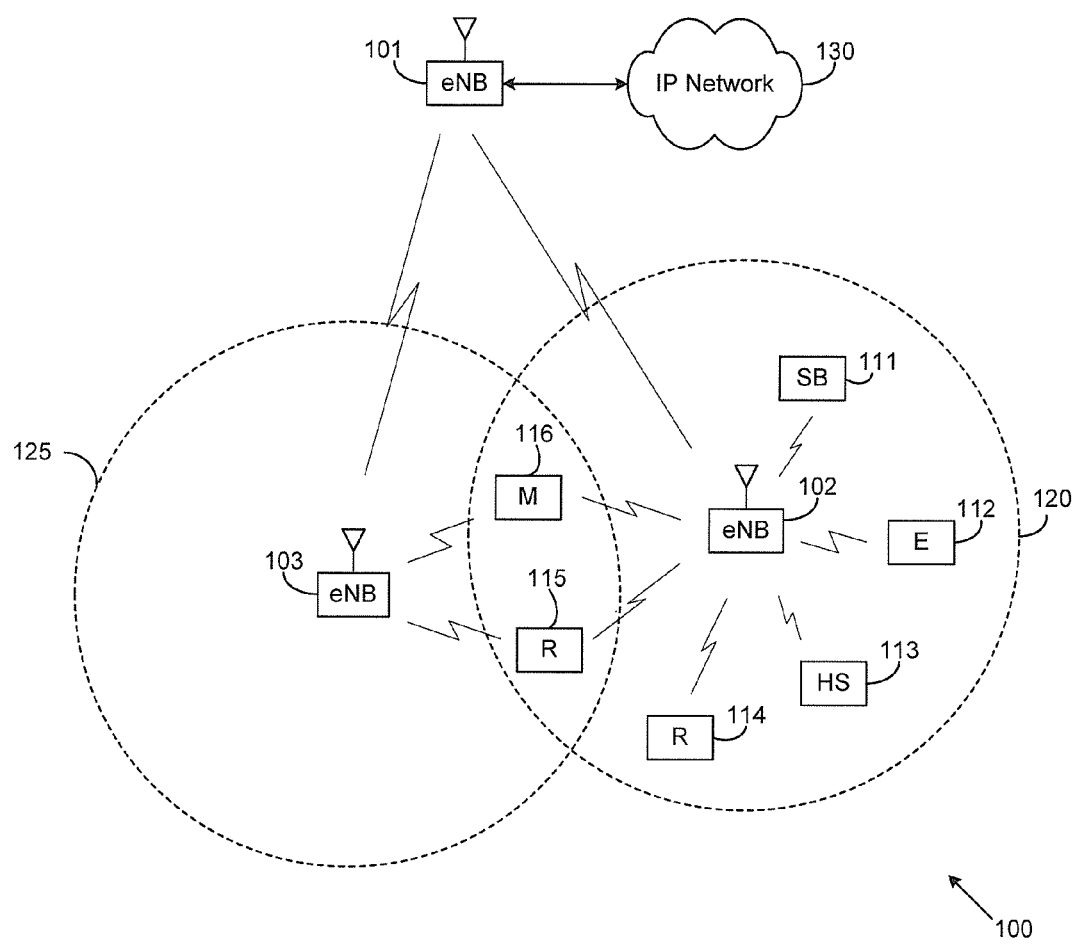
FIG. 1 illustrates an example wireless network according to this disclosure.

FIG. 1 illustrates an example wireless network 100 according to this disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes an eNodeB (eNB) 101, an eNB 102, and an eNB 103. The eNB 101 communicates with the eNB 102 and the eNB 103. The eNB 101 also communicates with at least one Internet Protocol (IP) network 130, such as the Internet, a proprietary IP network, or other data network.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M) like a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, LTE-A, WiMAX, or other advanced wireless communication techniques.

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of the eNBs 101-103 include an apparatus for integrating the antenna feed into a multilayer PCB containing multiple conductive and dielectric layers. The antenna feed board is integrated onto the multilayer PCB board that hosts the rest of the critical telecommunications system components, such as at least one transceiver unit and a baseband unit. The overall thickness of the integrated board is less than 2.54 mm (0.100"), and can be mass produced with low cost and high reliability.

Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNB 101, 102, and/or 103 could provide access to other or additional external networks, such as external telephone networks or other types of data networks.

Figure 2A:
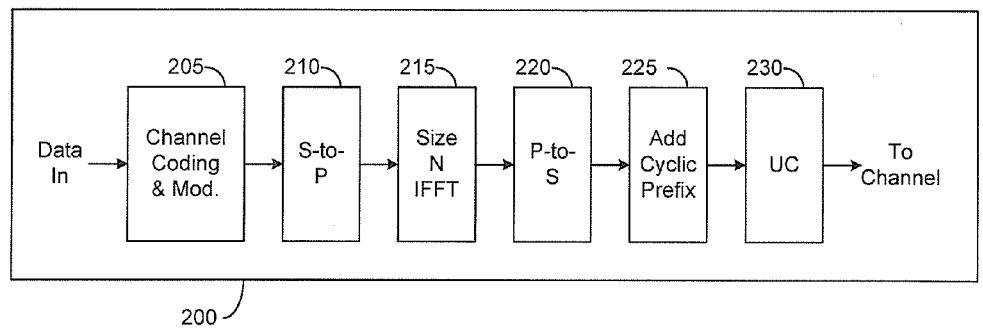
FIGS. 2A and 2B illustrate example wireless transmit and receive paths according to this disclosure.
Figure 2B:
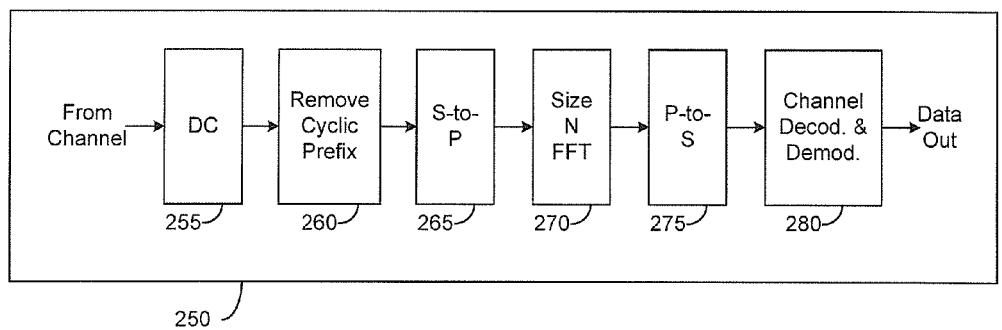

FIGS. 2A and 2B illustrate example wireless transmit and receive paths according to this disclosure. In the following description, a transmit path 200 may be described as being implemented in an eNB (such as eNB 102), while a receive path 250 may be described as being implemented in a UE (such as UE 116). However, it will be understood that the receive path 250 could be implemented in an eNB and that the transmit path 200 could be implemented in a UE. In some embodiments, the transmit path 200 and receive path 250 include an apparatus for integrating the antenna feed into a multilayer PCB containing multiple conductive and dielectric layers.

The transmit path 200 includes a channel coding and modulation block 205, a serial-to-parallel (S-to-P) block 210, a size N Inverse Fast Fourier Transform (IFFT) block 215, a parallel-to-serial (P-to-S) block 220, an add cyclic prefix block 225, and an up-converter (UC) 230. The receive path 250 includes a down-converter (DC) 255, a remove cyclic prefix block 260, a serial-to-parallel (S-to-P) block 265, a size N Fast Fourier Transform (FFT) block 270, a parallel-to-serial (P-to-S) block 275, and a channel decoding and demodulation block 280.

In the transmit path 200, the channel coding and modulation block 205 receives a set of information bits, applies coding (such as a low-density parity check (LDPC) coding), and modulates the input bits (such as with Quadrature Phase Shift Keying (QPSK) or Quadrature Amplitude Modulation (QAM)) to generate a sequence of frequency-domain modulation symbols. The serial-to-parallel block 210 converts (such as de-multiplexes) the serial modulated symbols to parallel data in order to generate N parallel symbol streams, where N is the IFFT/FFT size used in the eNB 102 and the UE 116. The size N IFFT block 215 performs an IFFT operation on the N parallel symbol streams to generate time-domain output signals. The parallel-to-serial block 220 converts (such as multiplexes) the parallel time-domain output symbols from the size N IFFT block 215 in order to generate a serial time-domain signal. The add cyclic prefix block 225 inserts a cyclic prefix to the time-domain signal. The up-converter 230 modulates (such as up-converts) the output of the add cyclic prefix block 225 to an RF frequency for transmission via a wireless channel. The signal may also be filtered at baseband before conversion to the RF frequency.

A transmitted RF signal from the eNB 102 arrives at the UE 116 after passing through the wireless channel, and reverse operations to those at the eNB 102 are performed at the UE 116. The down-converter 255 down-converts the received signal to a baseband frequency, and the remove cyclic prefix block 260 removes the cyclic prefix to generate a serial time-domain baseband signal. The serial-to-parallel block 265 converts the time-domain baseband signal to parallel time domain signals. The size N FFT block 270 performs an FFT algorithm to generate N parallel frequency-domain signals. The parallel-to-serial block 275 converts the parallel frequency-domain signals to a sequence of modulated data symbols. The channel decoding and demodulation block 280 demodulates and decodes the modulated symbols to recover the original input data stream.

Each of the eNBs 101-103 may implement a transmit path 200 that is analogous to transmitting in the downlink to UEs 111-116 and may implement a receive path 250 that is analogous to receiving in the uplink from UEs 111-116. Similarly, each of UEs 111-116 may implement a transmit path 200 for transmitting in the uplink to eNBs 101-103 and may implement a receive path 250 for receiving in the downlink from eNBs 101-103.

Each of the components in FIGS. 2A and 2B can be implemented using only hardware or using a combination of hardware and software/firmware. As a particular example, at least some of the components in FIGS. 2A and 2B may be implemented in software, while other components may be implemented by configurable hardware or a mixture of software and configurable hardware. For instance, the FFT block 270 and the IFFT block 215 may be implemented as configurable software algorithms, where the value of size N may be modified according to the implementation.

Furthermore, although described as using FFT and IFFT, this is by way of illustration only and should not be construed to limit the scope of this disclosure. Other types of transforms, such as Discrete Fourier Transform (DFT) and Inverse Discrete Fourier Transform (IDFT) functions, could be used. It will be appreciated that the value of the variable N may be any integer number (such as 1, 2, 3, 4, or the like) for DFT and IDFT functions, while the value of the variable N may be any integer number that is a power of two (such as 1, 2, 4, 8, 16, or the like) for FFT and IFFT functions.

Although FIGS. 2A and 2B illustrate examples of wireless transmit and receive paths, various changes may be made to FIGS. 2A and 2B. For example, various components in FIGS. 2A and 2B could be combined, further subdivided, or omitted and additional components could be added according to particular needs. Also, FIGS. 2A and 2B are meant to illustrate examples of the types of transmit and receive paths that could be used in a wireless network. Any other suitable architectures could be used to support wireless communications in a wireless network.

Figure 3A:
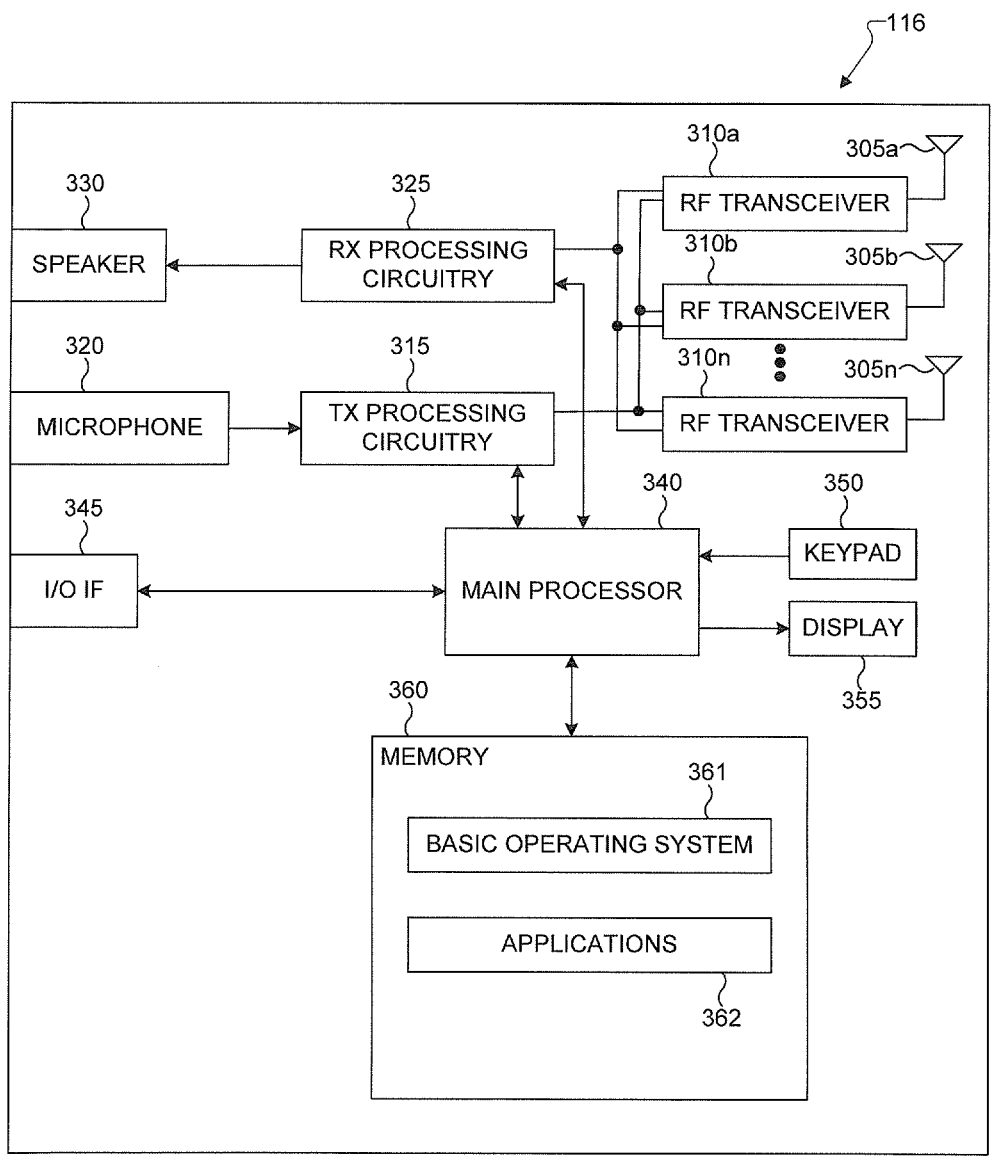
FIG. 3A illustrates an example user equipment (UE) according to this disclosure.

FIG. 3A illustrates an example UE 116 according to this disclosure. The embodiment of the UE 116 illustrated in FIG. 3 is for illustration only, and the UEs 111-115 of FIG. 1A could have the same or similar configuration. However, UEs come in a wide variety of configurations, and FIG. 3A does not limit the scope of this disclosure to any particular implementation of a UE.

The UE 116 includes multiple antennas 305a-305n, radio frequency (RF) transceivers 310a-310n, transmit (TX) processing circuitry 315, a microphone 320, and receive (RX) processing circuitry 325. The TX processing circuitry 315 and RX processing circuitry 325 are respectively coupled to each of the RF transceivers 310a-310n, for example, coupled to RF transceiver 310a, RF transceiver 210b through to a $N^{th}$ RF transceiver 310n, which are coupled respectively to antenna 305a, antenna 305b and an $N^{th}$ antenna 305n. In certain embodiments, the UE 116 includes a single antenna 305a and a single RF transceiver 310a. In certain embodiments, one or more of the antennas 305 include an apparatus for integrating the antenna feed into a multilayer PCB containing multiple conductive and dielectric layers. The UE 116 also includes a speaker 330, a main processor 340, an input/output (I/O) interface (IF) 345, a keypad 350, a display 355, and a memory 360. The memory 360 includes a basic operating system (OS) program 361 and one or more applications 362.

The RF transceivers 310a-310n receive, from respective antennas 305a-305n, an incoming RF signal transmitted by an eNB or AP of the network 100. In certain embodiments, each of the RF transceivers 310a-310n and respective antennas 305a-305n is configured for a particular frequency band or technological type. For example, a first RF transceiver 310a and antenna 305a can be configured to communicate via a near-field communication, such as BLUETOOTH®, while a second RF transceiver 310b and antenna 305b can be configured to communicate via a IEEE 802.11 communication, such as Wi-Fi, and another RF transceiver 310n and antenna 305n can be configured to communicate via cellular communication, such as 3G, 4G, 5G, LTE, LTE-A, or WiMAX. In certain embodiments, one or more of the RF transceivers 310a-310n and respective antennas 305a-305n is configured for a particular frequency band or same technological type. The RF transceivers 310a-310n down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the main processor 340 for further processing (such as for web browsing data).

The TX processing circuitry 315 receives analog or digital voice data from the microphone 320 or other outgoing baseband data (such as web data, e-mail, or interactive video game data) from the main processor 340. The TX processing circuitry 315 encodes, multiplexes, and/or digitizes the outgoing baseband data to generate a processed baseband or IF signal. The RF transceivers 310a-310n receive the outgoing processed baseband or IF signal from the TX processing circuitry 315 and up-converts the baseband or IF signal to an RF signal that is transmitted via one or more of the antennas 305a-305n.

The main processor 340 can include one or more processors or other processing devices and execute the basic OS program 361 stored in the memory 360 in order to control the overall operation of the UE 116. For example, the main processor 340 could control the reception of forward channel signals and the transmission of reverse channel signals by the RF transceivers 310a-310n, the RX processing circuitry 325, and the TX processing circuitry 315 in accordance with well-known principles. In some embodiments, the main processor 340 includes at least one microprocessor or microcontroller.

The main processor 340 is also capable of executing other processes and programs resident in the memory 360. The main processor 340 can move data into or out of the memory 360 as required by an executing process. In some embodiments, the main processor 340 is configured to execute the applications 362 based on the OS program 361 or in response to signals received from eNBs or an operator. The main processor 340 is also coupled to the I/O interface 345, which provides the UE 116 with the ability to connect to other devices such as laptop computers and handheld computers. The I/O interface 345 is the communication path between these accessories and the main controller 340.

The main processor 340 is also coupled to the keypad 350 and the display unit 355. The user of the UE 116 can use the keypad 350 to enter data into the UE 116. The display 355 can be a liquid crystal display or other display capable of rendering text or at least limited graphics, such as from web sites, or a combination thereof.

The memory 360 is coupled to the main processor 340. Part of the memory 360 could include a random access memory (RAM), and another part of the memory 360 could include a Flash memory or other read-only memory (ROM).

Although FIG. 3A illustrates one example of UE 116, various changes may be made to FIG. 3A. For example, various components in FIG. 3A could be combined, further subdivided, or omitted and additional components could be added according to particular needs. As a particular example, the main processor 340 could be divided into multiple processors, such as one or more central processing units (CPUs) and one or more graphics processing units (GPUs). Also, while FIG. 3 illustrates the UE 116 configured as a mobile telephone or smartphone, UEs could be configured to operate as other types of mobile or stationary devices.

Figure 3B:
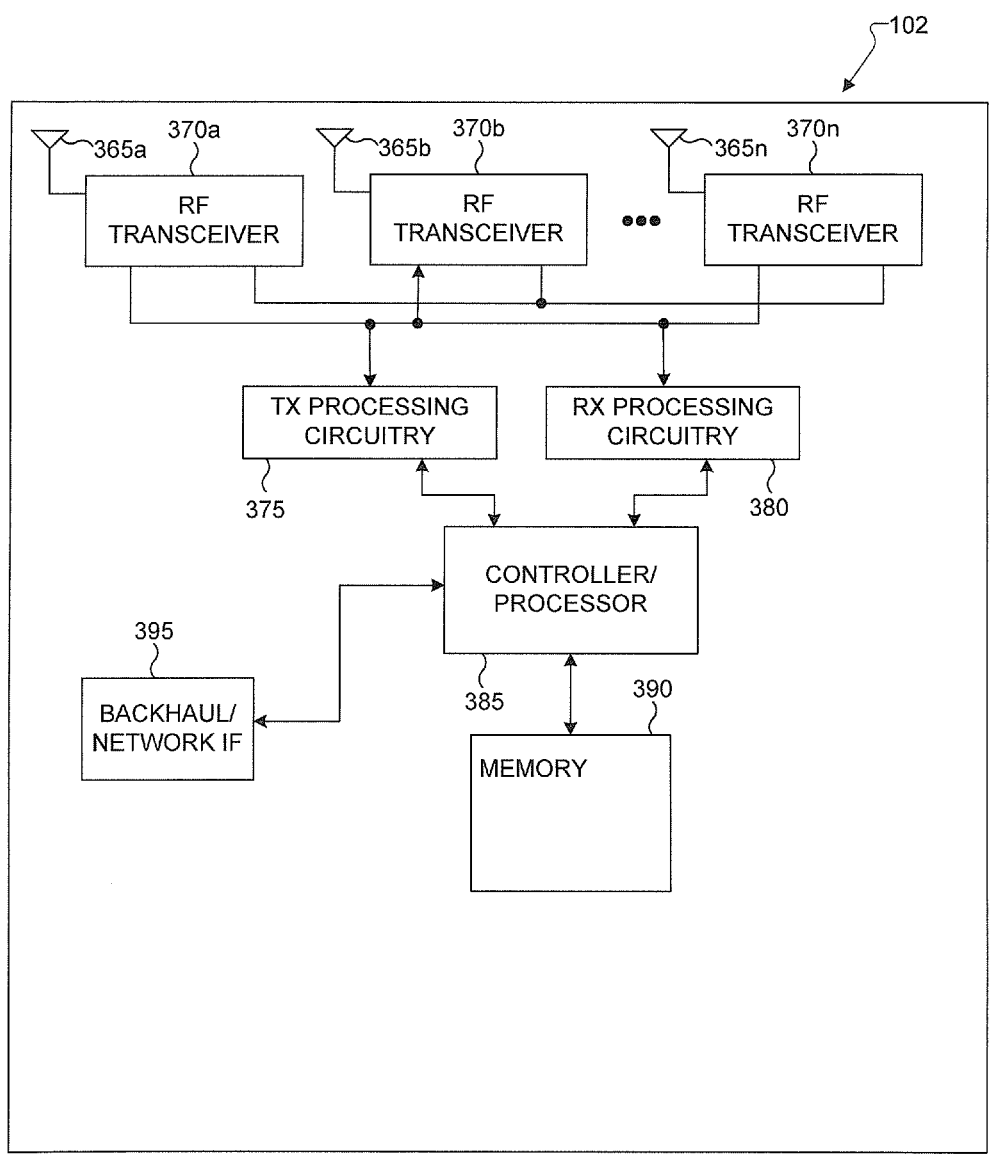
FIG. 3B illustrates an example evolved NodeB (eNB) according to this disclosure.

FIG. 3B illustrates an example eNB 102 according to this disclosure. The embodiment of the eNB 102 shown in FIG. 3B is for illustration only, and other eNBs of FIG. 1 could have the same or similar configuration. However, eNBs come in a wide variety of configurations, and FIG. 3B does not limit the scope of this disclosure to any particular implementation of an eNB.

The eNB 102 includes multiple antennas 365a-365n, multiple RF transceivers 370a-370n, transmit (TX) processing circuitry 375, and receive (RX) processing circuitry 380. The eNB 102 also includes a controller/processor 385, a memory 390, and a backhaul or network interface 395.

The RF transceivers 370a-370n receive, from the antennas 365a-365n, incoming RF signals, such as signals transmitted by UEs or other eNBs. The RF transceivers 370a-370n down-convert the incoming RF signals to generate IF or baseband signals. The IF or baseband signals are sent to the RX processing circuitry 380, which generates processed baseband signals by filtering, decoding, and/or digitizing the baseband or IF signals. The RX processing circuitry 320 transmits the processed baseband signals to the controller/processor 385 for further processing. In certain embodiments, one or more of the antennas 370 or RF transceivers 370a-370n include an apparatus for integrating the antenna feed into a multilayer PCB containing multiple conductive and dielectric layers.

The TX processing circuitry 375 receives analog or digital data (such as voice data, web data, e-mail, or interactive video game data) from the controller/processor 385. The TX processing circuitry 375 encodes, multiplexes, and/or digitizes the outgoing baseband data to generate processed baseband or IF signals. The RF transceivers 370a-370n receive the outgoing processed baseband or IF signals from the TX processing circuitry 385 and up-converts the baseband or IF signals to RF signals that are transmitted via the antennas 365a-365n.

The controller/processor 385 can include one or more processors or other processing devices that control the overall operation of the eNB 102. For example, the controller/processor 385 could control the reception of forward channel signals and the transmission of reverse channel signals by the RF transceivers 370a-370n, the RX processing circuitry 380, and the TX processing circuitry 375 in accordance with well-known principles. The controller/processor 385 could support additional functions as well, such as more advanced wireless communication functions. For instance, the controller/processor 385 could support beam forming or directional routing operations in which outgoing signals from multiple antennas 365a-365n are weighted differently to effectively steer the outgoing signals in a desired direction. Any of a wide variety of other functions could be supported in the eNB 102 by the controller/processor 385. In some embodiments, the controller/processor 385 includes at least one microprocessor or microcontroller.

The controller/processor 385 is also capable of executing programs and other processes resident in the memory 390, such as a basic OS. The controller/processor 385 can move data into or out of the memory 390 as required by an executing process.

The controller/processor 325 is also coupled to the backhaul or network interface 395. The backhaul or network interface 395 allows the eNB 102 to communicate with other devices or systems over a backhaul connection or over a network. The interface 395 could support communications over any suitable wired or wireless connection(s). For example, when the eNB 102 is implemented as part of a cellular communication system (such as one supporting 5G, LTE, or LTE-A), the interface 395 could allow the eNB 102 to communicate with other eNBs over a wired or wireless backhaul connection. When the eNB 102 is implemented as an access point, the interface 395 could allow the eNB 102 to communicate over a wired or wireless local area network or over a wired or wireless connection to a larger network (such as the Internet). The interface 395 includes any suitable structure supporting communications over a wired or wireless connection, such as an Ethernet or RF transceiver.

The memory 390 is coupled to the controller/processor 385. Part of the memory 390 could include a RAM, and another part of the memory 390 could include a Flash memory or other ROM.

As described in more detail below, the transmit and receive paths of the eNB 102 (implemented using the RF transceivers 370a-370n, TX processing circuitry 375, and/or RX processing circuitry 380) support communication with aggregation of FDD cells and TDD cells.

Although FIG. 3B illustrates one example of an eNB 102, various changes may be made to FIG. 3B. For example, the eNB 102 could include any number of each component shown in FIG. 3B. As a particular example, an access point could include a number of interfaces 395, and the controller/processor 385 could support routing functions to route data between different network addresses. As another particular example, while shown as including a single instance of TX processing circuitry 375 and a single instance of RX processing circuitry 380, the eNB 102 could include multiple instances of each (such as one per RF transceiver).

Figure 4:
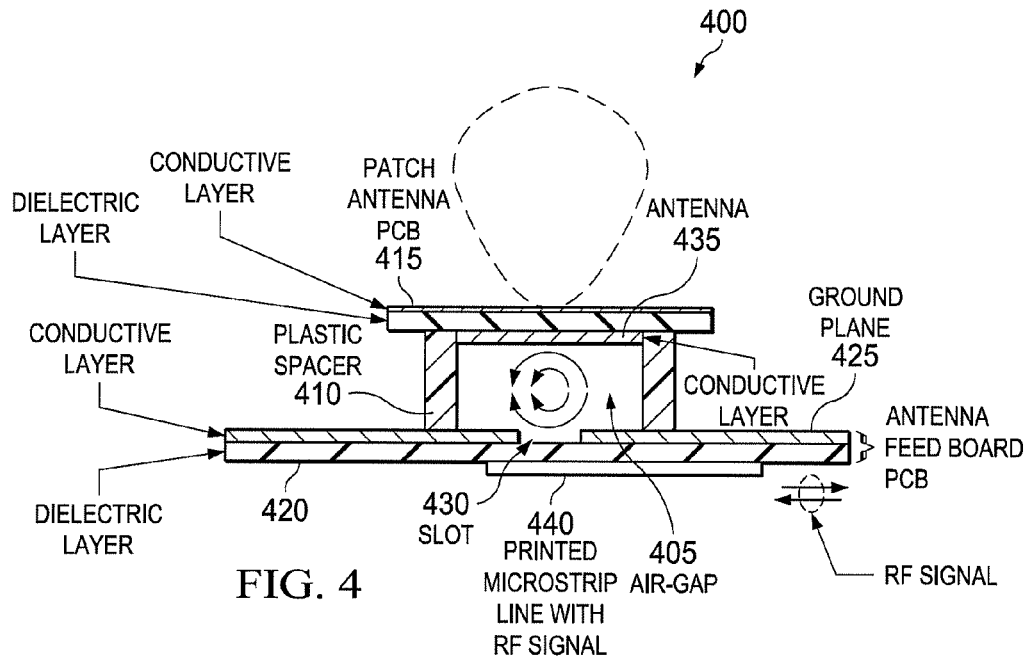
FIG. 4 illustrates a Patch Antenna Feed using Slot Coupled Microstrip.
Figure 5:
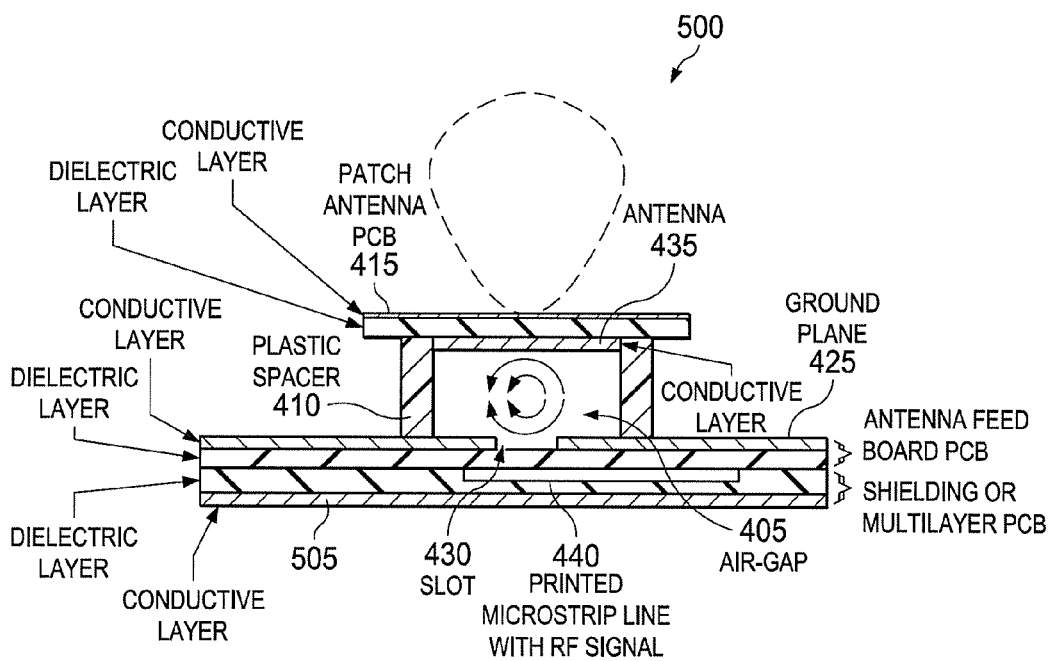
FIG. 5 illustrates Multilayer printed circuitry board (PCB) Patch Antenna Feed.

FIG. 4 illustrates a Patch Antenna Feed 400 using Slot Coupled Microstrip. Two popular antenna elements used in FD-MIMO BS arrays, the patch and dipole antennas, can both suffer from performance degradation when attempted to be integrated with other RF components. In particular, for the printed microstrip patch antenna to cover the bandwidth of about 10% as needed for operation in LTE TDD #41, #42 and FDD #7, #22 bands, an air gap 405 of about 1-5 mm has to be used instead of a dielectric substrate. The air gap 405 can be created by using plastic spacers 410 to secure the patch antenna board 415 at the required distance over the board 420 with the ground plane 425 and the slot 430 opening. In that case feeding the patch antenna by direct electric contact, such as using some sort of probe feed technique is not a good practice, because it increases the mechanical complexity, reduces reliability, increases the overall cost and requires customization which hinders assembly and production. Therefore, Patch Antenna Feed 400 uses an aperture coupled feeding technique, where the slot 430 is opened on the antenna ground plane 425 in the area under the patch antenna 435 and the RF signal is coupled to the patch antenna 415 from a printed transmission line 440 that crosses over the slot 430 opening.

Figure 6:
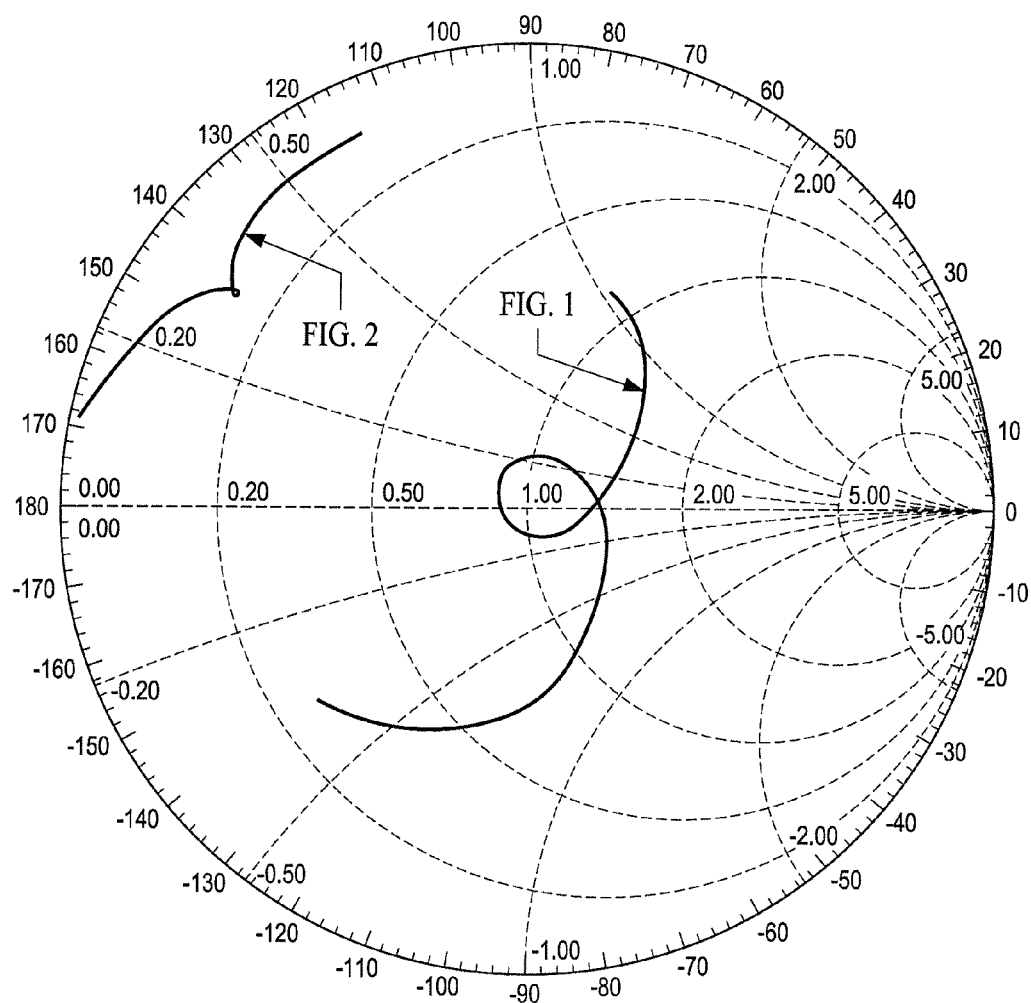
FIG. 6 illustrates Smith Chart Antenna Impedance for Typical Slot Feed in FIG. 4 versus Multi-layer PCB Slot Feed in FIG. 5.

This is a typical way of feeding aperture coupled patch antennas. However, this technique requires that the slot 430 and printed microstrip 440 feed line be at least $\lambda/8$ away of metallic surfaces from beneath. If a conductive layer 505 is placed flush, underneath the slot 430, for shielding purposes for example, or as part of a conductive layer of a multilayer PCB stack-up, as in the Multilayer printed circuitry board (PCB) Patch Antenna Feed 500 shown in FIG. 5, the slot 430 gets practically short-circuited by the metal layer, or equivalently its quality factor Q becomes very high and the antenna bandwidth and impedance are severely impacted. For example, $\lambda/8$ at band #41 (2.496-2.69 GHz) equates to a distance of 14.4 mm (0.567"). This is the minimum distance the feed line must be from any copper signal traces or ground planes/traces in a multi-layer PCB or else the antenna impedance diverges far from our desired 50 ohm ($\Omega$) target as shown in FIG. 6. The impact of this $\lambda/8$ spacing requirement is that it is not feasible to route a slot-fed microstrip antenna feed-line onto a multi-layer PCB because the maximum thickness of modern PCB's is limited to <5.08 mm (0.200").

Figure 7:
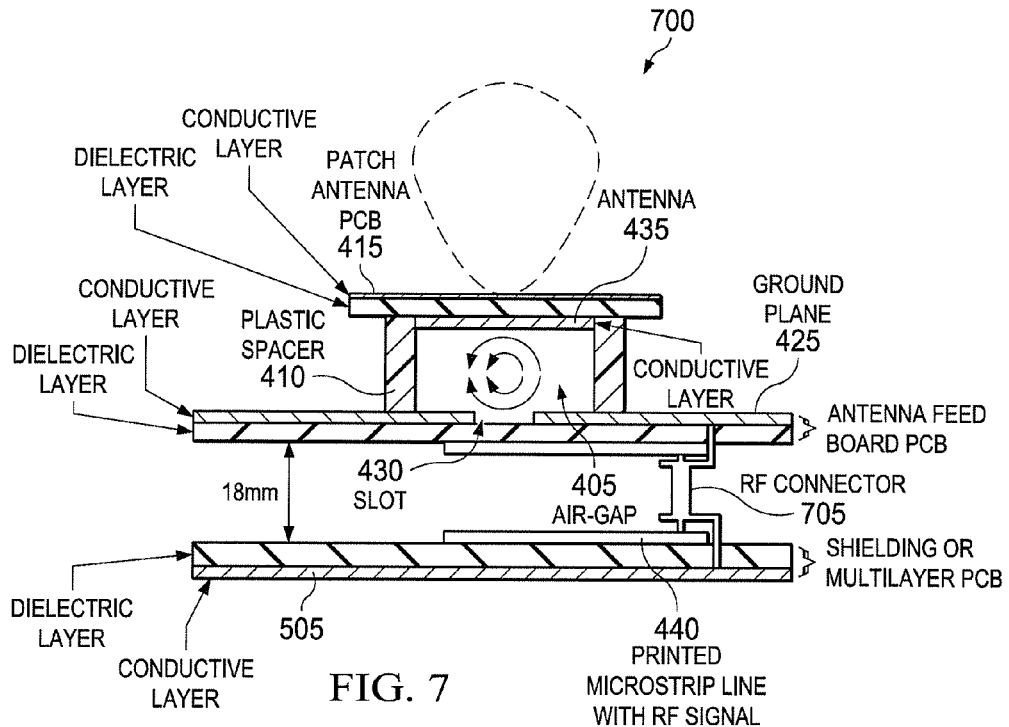
FIG. 7 illustrates a diagram of an Antenna Feed Circuit attached to a Multilayer PCB using Connectors.

To avoid this shortcoming, previous methods separate the shielding layer or the top conductive layer 505 of the multi-layer PCB board by a distance $>\lambda/8$ from the antenna feed board and a RF connector 705 is used to transfer the RF signal from the transceiver, which is typically hosted on the multi-layer PCB, to the antenna feed board as shown in the antenna feed circuit 700 shown in FIG. 7.

The length of the RF connector 705 at cellular frequencies is typically around 18 mm. The antenna feed circuit 700 configuration of FIG. 7 is not very practical because the antenna feed circuit 700 configuration increases the overall antenna form factor, increases cost due to costly RF connectors and adapters, it cause extra loss in the system, increases the complexity of the assembly and reduces reliability (especially when it comes to mass production), increases the overall weight (considering a practical antenna system with about a hundred antennas-connectors) and finally is sensitive to misalignment errors between the two boards and the RF connectors.

Embodiments of the present disclosure illustrate a method and apparatus to integrate the antenna feed board onto the multilayer PCB board that hosts the rest of the critical tele-communications system components, such as at least one transceiver unit and a baseband unit. The overall thickness of the integrated board is less than 2.54 mm (0.100"), and can be mass produced with low cost and high reliability.

Figure 8:
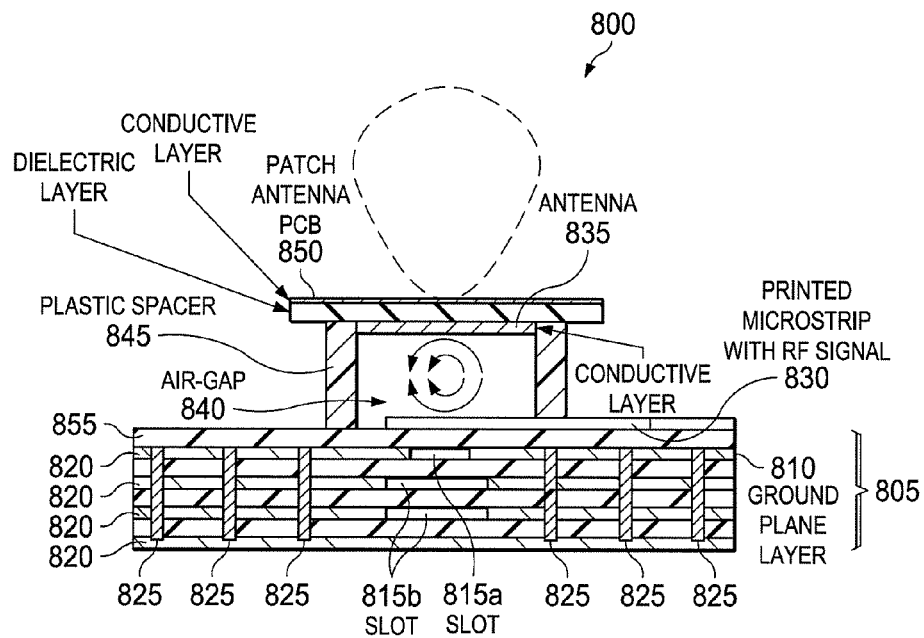
FIG. 8 illustrates an antenna feed circuit integrated into a Multilayer PCB according to this disclosure.

FIG. 8 illustrates an antenna feed circuit integrated into a Multilayer PCB according to this disclosure. The embodiment of the antenna feed circuit 800 shown in FIG. 8 is for illustration only. In certain embodiments, one or more of the antennas 365 or transceivers 370 of eNB 102 could have the same or similar configuration. Other embodiments of the antenna feed circuit 800 could be used without departing from the scope of the present disclosure.

The antenna feed circuit 800 is integrated into a multilayer PCB 805. To avoid blocking a slot opening 815a on the antenna ground plane 810 layer, slots 815b are opened on all consecutive conducting layers 820 on the multilayer PCB 805 board below the main antenna feed slot 815. Interconnecting conductive vias 825 are incorporated as needed to ensure electrical connection of portions of the conductive layers 820 to the system and antenna ground plane 810 layers. The vias 825 are distributed across a substantial portion of the area of the multilayer PCB 805, but kept out and away from the slot 815 openings on all conductive layers 820. The antenna feed circuit 800 includes a patch antenna 835. In certain embodiments, the patch antenna 835 is the antenna 365. The mircros-trip line 830 carrying the RF signal to be coupled to the patch antenna 835 is placed over the top conducting layer 820 and partially below the patch antenna 835. The air gap 840 is created plastic spacers 845 that secure the patch antenna board 850 at the required distance over the board 855 with the ground plane 810.

Figure 9:
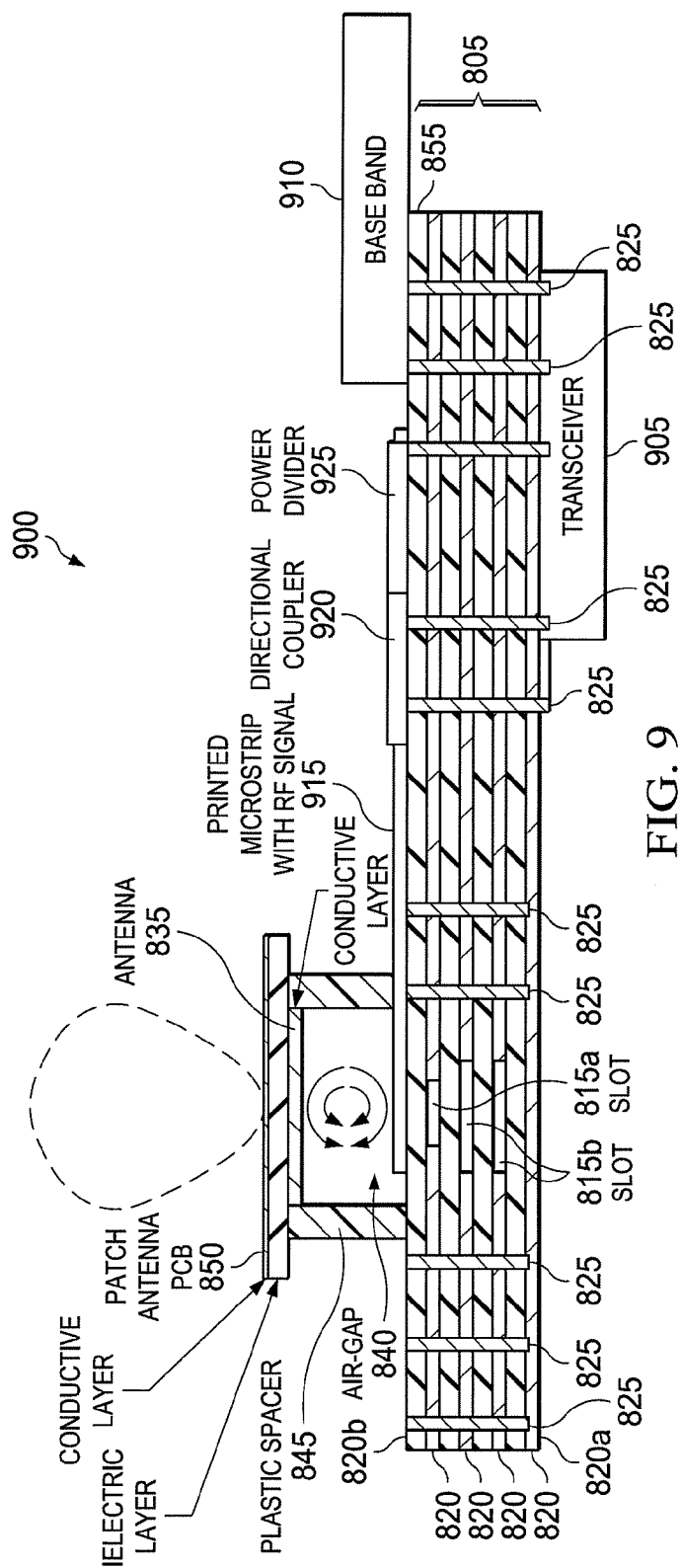
FIG. 9 illustrates multilayer PCB board with the antenna feed apparatus integrated according to this disclosure.

FIG. 9 illustrates multilayer PCB board with the antenna feed apparatus integrated according to this disclosure. The embodiment of the multilayer PCB board with the antenna feed apparatus integrated 900 shown in FIG. 9 is for illustration only. In certain embodiments, one or more of the antennas 365 or transceivers 370 of eNB 102 could have the same or similar configuration. Other embodiments of the antenna feed circuit 900 could be used without departing from the scope of the present disclosure.

The multilayer PCB board with the antenna feed apparatus integrated 900 includes a transceiver 905. The transceiver 905 and baseband 910 comprise portions of the transceiver 370. The transceiver 905 includes a power amplifier, filter, transmit and receive (TRX) switch, duplexer, mixer, analog to digital converter (ADC)/digital to analog converter (DAC). The electrical components of the transceiver unit 905 are in majority coupled to a conductive layer 820a at the bottom side of the multilayer PCB 805 board and electrical connection to the antenna feed line 915, which can be a printed microstrip line 830, which is above a conductive layer 820 at the top side of the multilayer PCB 805 board, is done with interconnecting vias 825. A printed directional coupler 920 and power divider 925 are also placed above the conductive layer 820 at a top side of the multilayer PCB board 855 and are electrically connected to the antenna feed line 915. A baseband unit 910 is hosted above a top side of the PCB board 855 and electrically connected to the transceiver unit 905 by interconnecting vias 825. The baseband unit 910 including a processing circuit, such as an ASIC, FPGA, DSP, a memory, and the like.

Figure 10:
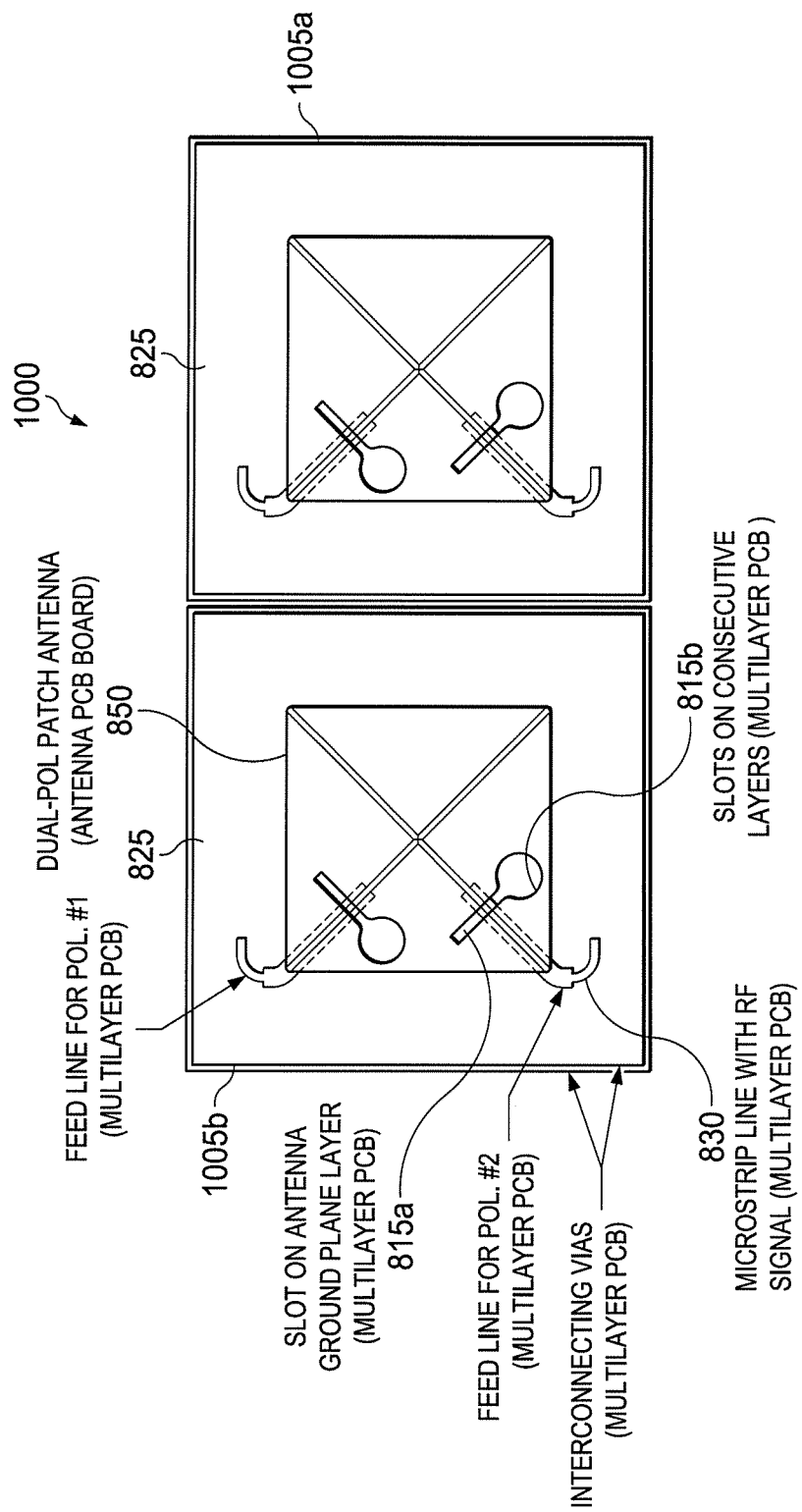
FIG. 10 illustrates a Dual-Polarized Antenna Patch Board Sitting Above the Proposed Antenna Feed Multilayer PCB according to this disclosure.

FIG. 10 illustrates a Dual-Polarized Antenna Patch Board Sitting Above the Proposed Antenna Feed Multilayer PCB according to this disclosure. The embodiment of the Dual-Polarized Antenna Patch Board 1000 shown in FIG. 10 is for illustration only. In the example shown in FIG. 10, two elements are illustrated. Other embodiments could be used without departing from the scope of the present disclosure.

FIG. 10 shows a top view of a dual-polarized patch antenna array board, two elements 1005a and 1005b shown for example only, located a short distance above the multilayer PCB containing the feed apparatus described with respect to FIG. 8. An array of vias 825 are disposed through the multilayer PCB 805 and are regularly spaced by approximately λ/10. The vias 825 are configured to act as tuning elements to compensate for the poor feed line impedance, namely rotating it closer to 50Ω with respect to FIG. 6 that occurs due to the lack of vertical separation between the slot element on the antenna ground plane layer and the shielding layer on the bottom layer of the multilayer PCB. Without the compensating via array, it is not possible to integrate the antenna feed structure into the multilayer PCB due to the impedances indicated in FIG. 8. While an exact formula does not exist for the via array spacing, empirical results indicate λ/10-λ/12 yields optimal impedances in most cases, although these are not hard limits.

In addition to patch antennas 835, this integrated feed apparatus is also useful as a balun when feeding dipole antennas. Dipole antennas are known to provide larger bandwidth than patch antennas and also much lower cross-polarization fields. This feature makes them suitable for beamforming antenna arrays, such as those used in modern MIMO telecommunications systems. One drawback of dipole antennas is that they require balanced feeding and impedance matching. This is typically provided by an external balun and impedance transformer. The balun converts a single ended RF signal, such as a signal carried by a microstrip line 830 to a differential or balanced RF signal, such as a RF signal carried by a pair of coplanar strips, which can be used to feed a dipole antenna in the differential mode. An impedance transformer is needed to convert the system impedance, typically 50Ω, to the dipole antenna impedance, typically around 200Ω. This impedance transformation ratio (4:1) requires lengthy transmission line impedance transformers (>λ/4) that require extra space on the PCB board, making integration difficult. Finally, for optimum performance, dipole antennas need to be placed at approximately λ/4 over the ground plane.

Figure 11:
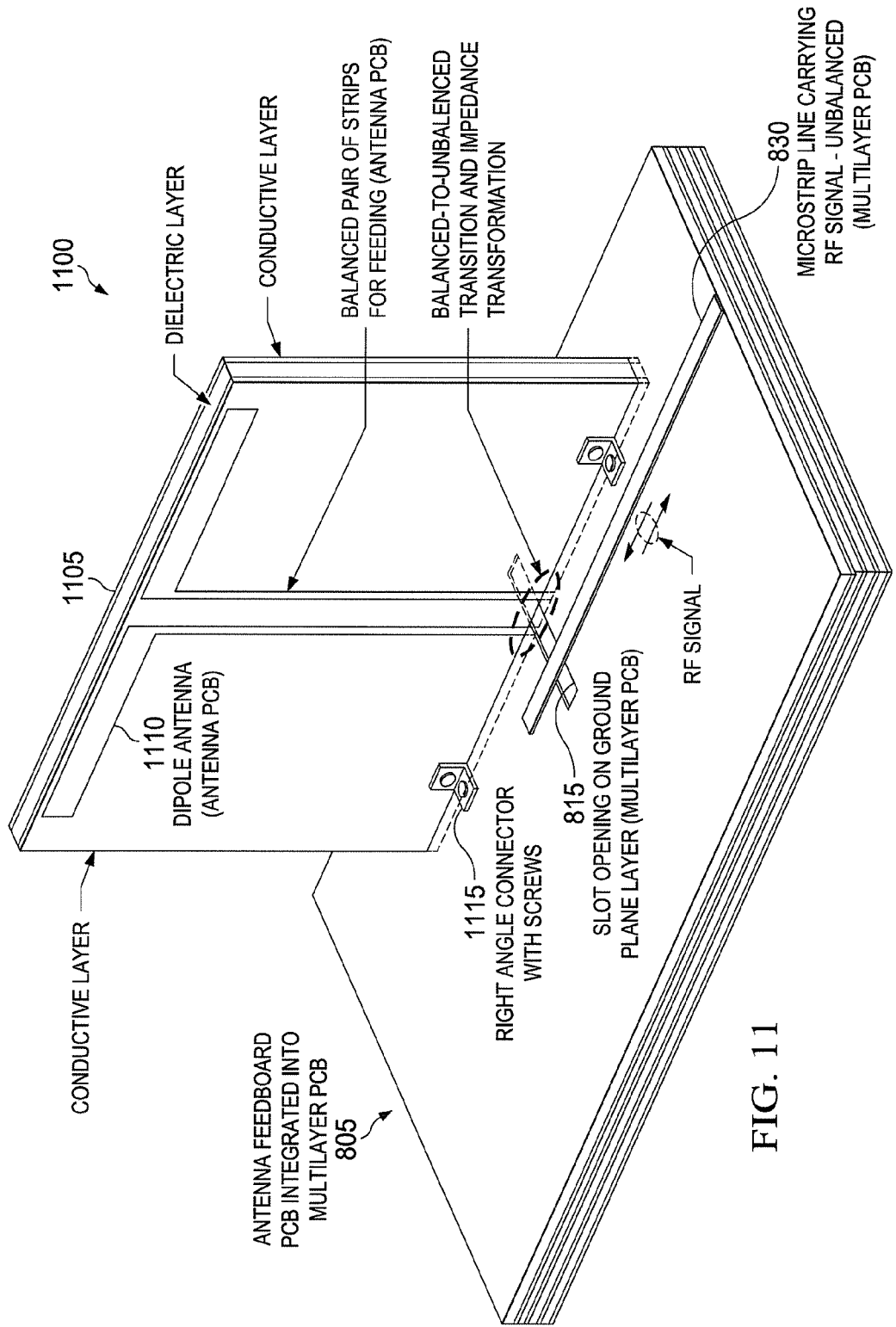
FIG. 11 illustrates a dipole antenna assembly according to this disclosure.

FIG. 11 illustrates a dipole antenna assembly according to this disclosure. The embodiment of the dipole antenna assembly 1100 shown in FIG. 11 is for illustration only. Other embodiments could be used without departing from the scope of the present disclosure.

As shown in the example illustrated in FIG. 11, the transition of a RF signal from a flat multilayer PCB board, which typically has the antenna ground plane and feed line on the top two layers, to the dipole antenna PCB board 1105 that lays at right angles to the multilayer PCB 805, is not straightforward. The dipole antenna 1100 includes a dipole antenna element 1110 disposed on the dipole antenna PCB board 1105. The dipole antenna PCB board 1105 is coupled to the multilayer PCB 805 via a fastening means 1115, such as a right angle connectors with screws, right angle connectors with adhesive, a plastic weld, other chemical bond, or a combination thereof. The dipole antenna PCB board 1105 is disposed over at least a portion of the slot 815 as is the mircrostrip line 830 carrying the RF signal.

Figure 12:
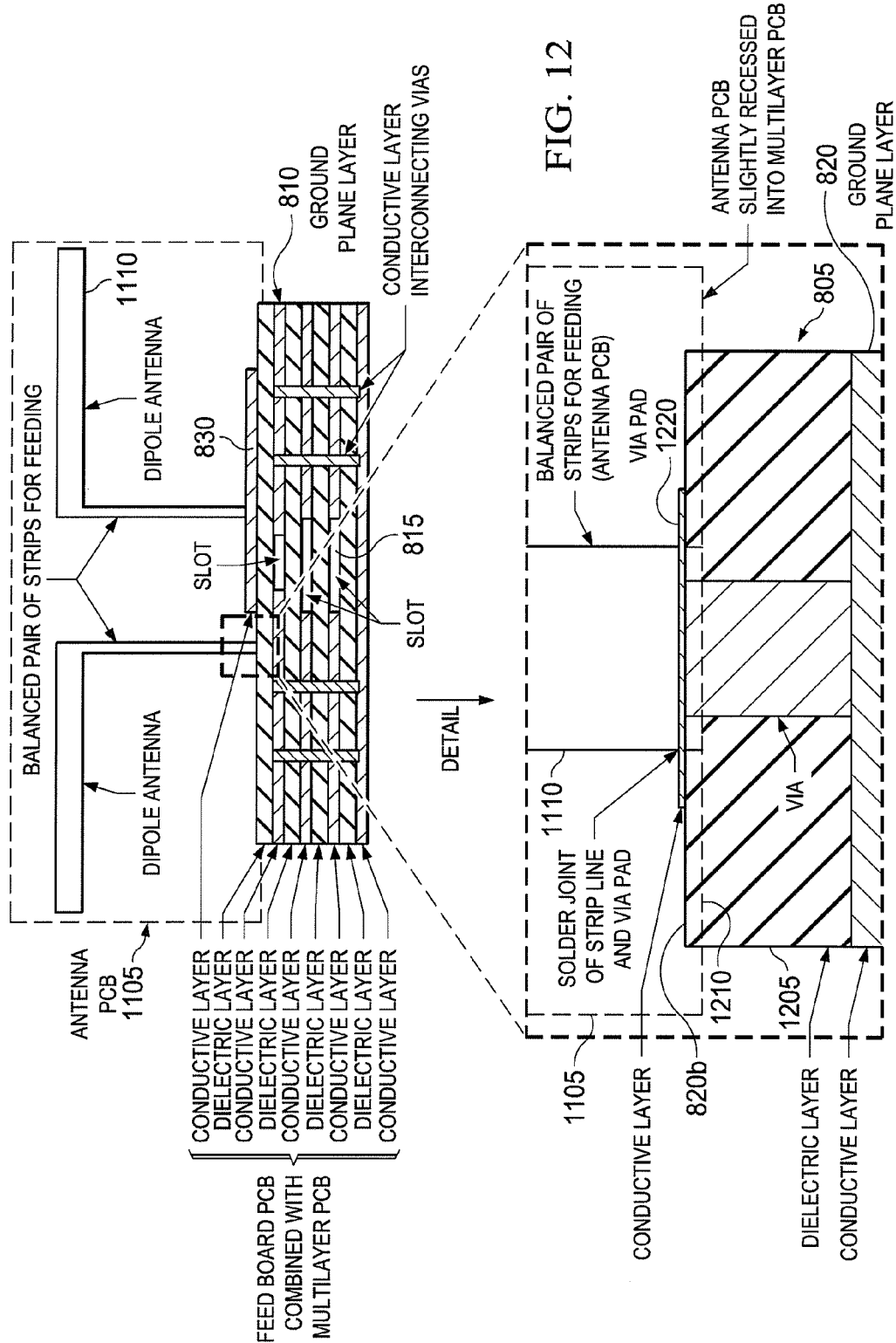
FIGS. 12 and 13 illustrate a transition from the dipole antenna PCB board of FIG. 11 to the multilayer PCB according to this disclosure.
Figure 13:
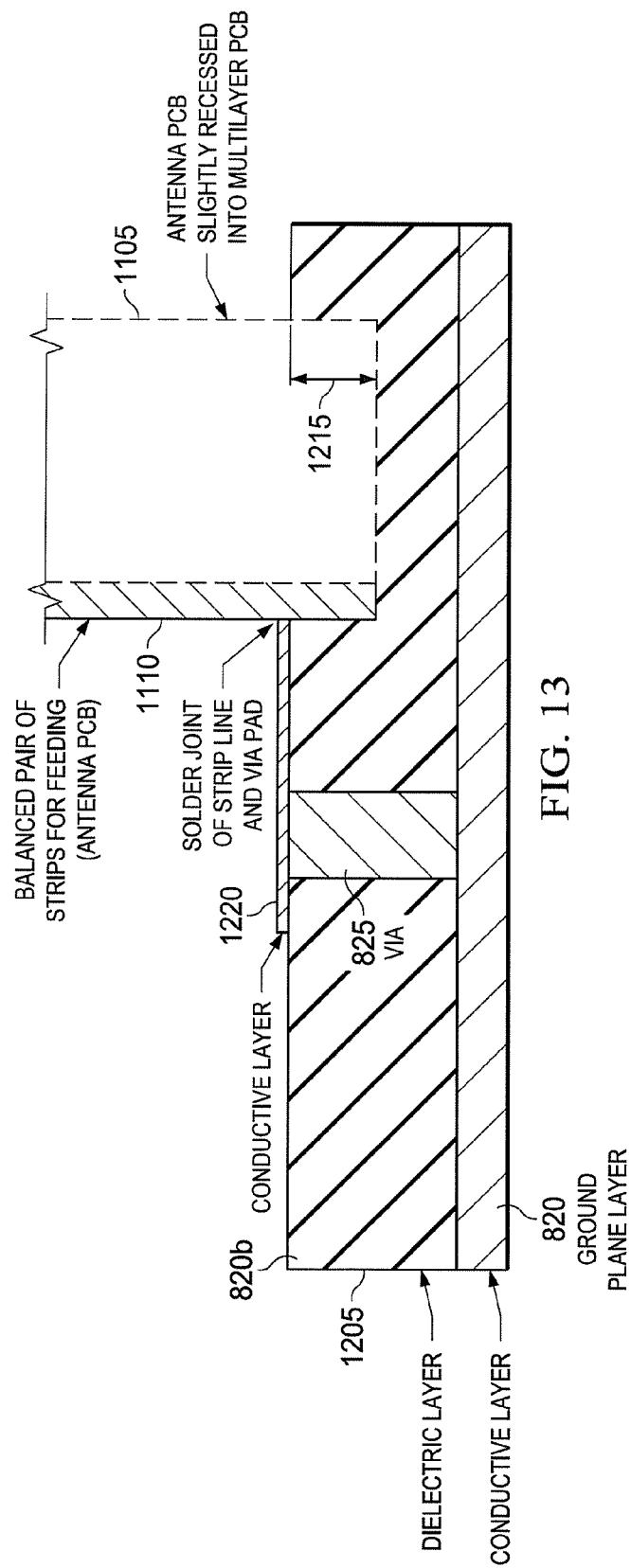

The integrated feed apparatus disclosed in embodiments of the present disclosure is adapted in FIGS. 11, 12 and 13 to function as a balun and impedance transformer for feeding dipole antennas. A transition from the dipole antenna PCB board 1105 to the multilayer PCB 805 is also disclosed in FIGS. 12 and 13. FIGS. 11, 12 and 13 show the apparatus disclosed in FIG. 8 for feeding a patch antenna, adapted for feeding a dipole antenna.

In the examples shown in FIGS. 12 and 13, the dipole antenna element of approximately λ/2 length is printed on the antenna PCB board 1105 with two conductive layers 820 and one dielectric layer 1205. The antenna PCB board 1105 is then placed at right angles to the multilayer PCB 805, which has the antenna feed line, namely the mircrostrip line 830 carrying the RF signal, and ground plane 810 on its two upper layers. In certain embodiments, the antenna PCB board 1105 is approximately λ/4 tall at the center frequency of operation. The dipole antenna PCB board 1105 is secured to the multilayer PCB 805 using fastening means 1115, such as a plastic right angle connectors with screws, right angle connectors with adhesive, a plastic weld, other chemical bond, or a combination thereof. In certain embodiments, a narrow and shallow groove is opened on the multilayer PCB board 805 right along an edge 1210 where the antenna PCB board 1105 and multilayer PCB board 805 physically contact. A width and length of the groove is equal to the thickness and length respectively, of the antenna PCB board 1105. The depth 1215 of the groove is smaller than the thickness of the first dielectric layer 1205 of the multilayer PCB board 805. With this configuration, the antenna PCB board 1105 can be slightly recessed into the multilayer PCB board 805 such that the two balanced strips for the antenna elements 1110 on the antenna PCB board 1105 make a solid and efficient electrical contact with via pads 1220 located on the multilayer PCB board 805 and shorted to the multilayer PCB ground with vias 825, on opposite sides of the slot 815 openings. In that way, a RF signal carried by a microstrip line 830, which is above the top conductive layer 820b of the multilayer PCB 805 and which crosses over a portion of the slot 815 opening on the antenna ground plane, which lays on the second conductive layer 820 of the multilayer PCB, can couple from the microstrip line 830 and through the slot 815 opening to the pair of balanced strips, namely antenna elements 1110, and hence radiate out by the dipole antenna 1100. This technique can be replicated at multiple locations for feeding a dipole array.

Although the present disclosure has been described with an exemplary embodiment, various changes and modifications may be suggested to one skilled in the art. It is intended that the present disclosure encompass such changes and modifications as fall within the scope of the appended claims.

What is claimed is:
1. An antenna system comprising:
an antenna element disposed proximate to a multilayer printed circuit board (PCB) stack-up; and
the multilayer PCB stack-up comprising:
N alternating conductive and dielectric layers, wherein a first conductive layer is configured to serve as an antenna ground plane layer and includes a slot opening with lateral dimensions smaller than lateral dimensions of the antenna element, a second conductive layer is configured to serve as a shielding layer, a third conductive layer is configured to serve as a system ground plane layer,
at least two first slot openings having lateral dimensions smaller than the lateral dimensions of the antenna element, the at least two slot openings disposed at similar lateral locations and through at least two consecutive conductive layers such that the slot openings substantially overlap with each other,
a transmission line printed on at least one conductive layer, the transmission line configured to carry a radio frequency (RF) signal and to coupled to the antenna element through at least one of the at least two slot openings, at least one conductive layer having portions configured to carry a direct current (DC) signal, at least one transceiver unit electrically to the transmission line, at least one baseband processing unit electrically connected to the transceiver unit, and a plurality of conductive layer-interconnecting vias configured to enable a conductive connection between the ground plane layer and portions of the antenna ground plane layer, the shielding layer and portions of the conductive layers of the multilayer PCB stack-up, the vias disposed through all conductive layers distributed across a substantial portion of the area of the multilayer PCB stack-up that does not include the slot openings.

2. The antenna system as set forth in claim 1, wherein the antenna element is printed on an antenna PCB board arranged above and at a plane substantially parallel to a plane of the multilayer PCB stack-up and at distance that is maintained by plastic spacers, the plastic spacers configured to form an airgap between the antenna PCB board and the multilayer PCB stack-up with no conductive connection is established there-between, the plastic spacers approximately 2-5 mm tall.

3. The antenna system as set forth in claim 2, wherein the antenna element comprises a patch antenna printed on a portion of a bottom conductive layer of a two layer antenna PCB board approximately 10-150 mils thick and with dielectric constant in the range of 1.1-5.5, and with the conductor removed completely from the top layer of the two layer PCB board, and the bottom layer of the antenna PCB board being the layer closest to the multilayer PCB stack-up.

4. The antenna system as set forth in claim 3, wherein the antenna element comprises a rectangular patch antenna having narrow slot cutout openings extending from corner to corner along two diagonals of the rectangular patch antenna.

5. The antenna system as set forth in claim 1, wherein the transmission line is printed on a top conductive layer of the multilayer PCB, the top conductive layer being the one closest to the antenna element, and wherein the transmission line comprises one of: a microstrip line, a coplanar waveguide line, or a coplanar pair of strips.

6. The antenna system as set forth in claim 5, where a second conductive layer disposed beneath the top conductive layer of the multilayer PCB stack-up is configured as the antenna ground plane and includes the at least one first slot opening with lateral dimensions smaller than the lateral dimensions of the antenna element, the at least one first slot opening configured to couple the RF signal from the transmission line to the antenna element.

7. The antenna system as set forth in claim 5, where the transmission line printed on top conductive layer crosses over a substantial portion of the slot opening through a different layer.

8. The antenna system as set forth in claim 5, where a third conductive layer, a fourth conductive layer, a fifth conductive layer, a sixth conductive layer, a seventh conductive layer and an eighth consecutive conductive layers each comprise slot openings of similar geometry and with lateral dimensions smaller to the lateral dimensions of the antenna element, the slot openings formed and disposed at similar lateral locations on each conductive layer such that the openings substantially overlap with each other and with the slot opening on the second conductive layer.

9. The antenna system as set forth in claim 1, wherein each of the conductive layers are configured to carry at least one of: a DC signal, an alternating current (AC) signal, or a ground signal.

10. The antenna system as set forth in claim 1, where the shielding layer is substantially covered with copper and does not include the slot opening and is configured to electrically shield a space below the shielding layer from the space above the shielding layer.

11. The antenna system as set forth in claim 1, wherein the slot openings comprise one of: a rectangular or circular shape.

12. The antenna system as set forth in claim 1, wherein a second slot opening is formed close and adjacent to each first slot opening on all conductive layers having the first slot opening, the second slot opening configured to couple a second RF signal to the antenna element to a mode having an orthogonal polarization, such that the antenna system is a dual-polarized antenna.

13. The antenna system as set forth in claim 12, wherein RF signal and the second RF signal are coupled to dual-polarized antenna elements through the first and second slot openings.

14. The antenna system as set forth in claim 1, where the plurality of vias are arranged in a two dimensional (2D) grid with at least one unit spacing around $\lambda/10$, where $\lambda$, is the operation wavelength.

15. The antenna system as set forth in claim 1, wherein:
the at least one transceiver unit includes a power amplifier, filter, transmit and receive (TRX) switch, duplexer, mixer, audio to digital converter (ADC)/digital to audio converter (DAC), electrically connected to the sixth consecutive conducting layer and electrically connected by interconnecting vias to the microstrip transmission line carrying the RF signal,
the baseband unit comprising a processing circuit, a memory, and electrically connected to the first conductive layer and electrically connected by interconnecting vias to the transceiver unit.

16. The antenna system as set forth in claim 1, where the antenna element is a dipole antenna element printed on a portion of a conductive layer of a two layer antenna PCB board and with a pair of two narrow conductive symmetric strip transmission lines separated by a small gap and attached on one side to one dipole feed terminal and configured to transfer the RF signal to the dipole antenna, the strips printed on a portion of a conductive layer of the antenna PCB board, the antenna PCB board disposed in a plane perpendicular to the multilayer PCB stack-up and such that the other side of the two conductive feed strip lines are in electrical contact with the antenna ground plane at two locations on substantially opposite sides of the slot opening formed on the antenna ground plane conductive layer of the multilayer PCB stack-up, such that an RF signal is coupled through the slot opening to the dipole antenna feed strips lines.

17. The antenna system as set forth in claim 16, where the pair of two narrow conductive symmetric strip transmission lines on the antenna PCB board extend to the bottom edge of the antenna PCB board.

18. The antenna system as set forth in claim 17, where the antenna PCB board is secured at right angles to the multilayer PCB stack-up and secured with a fastening means where the antenna PCB board and multilayer PCB board physically contact.

19. The antenna system as set forth in claim 18, where each of the conductive strip transmission lines on the antenna PCB is electrically connected to via pads on the surface of the multilayer PCB stack-up, where the lateral dimensions of the via pads are approximately equal to the width of each strip line, and each pad is electrically connected to the antenna ground plane with a conductive via, the via pads and vias each being on substantially opposite sides of the slot opening on the antenna ground plane layer of the multilayer PCB.

20. The antenna system as set forth in claim 1, where the antenna and multilayer PCB is contained in an enclosure with a planar metallic portion electrically connected to the system ground plane layer of the multilayer PCB stack-up and thermally connected to the heat sinks of the transceiver unit and baseband unit.

* * * * *